United States Patent
Porter et al.

(10) Patent No.: US 8,408,723 B2
(45) Date of Patent: Apr. 2, 2013

(54) BACKLIGHTING INDUCTIVE TOUCH BUTTONS

(75) Inventors: Stephen B. Porter, Gilbert, AZ (US); Keith Curtis, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 339 days.

(21) Appl. No.: 12/787,474

(22) Filed: May 26, 2010

(65) Prior Publication Data

US 2011/0050626 A1   Mar. 3, 2011

Related U.S. Application Data

(60) Provisional application No. 61/238,718, filed on Sep. 1, 2009.

(51) Int. Cl.
G02F 1/13357 (2006.01)
H04M 99/00 (2006.01)

(52) U.S. Cl. .............................. 362/23; 362/24; 362/97.3

(58) Field of Classification Search .................... 362/23, 362/24, 97.1, 97.2, 97.3
See application file for complete search history.

(56) References Cited

U.S. PATENT DOCUMENTS

| | | | | |
|---|---|---|---|---|
| 6,595,653 | B2 * | 7/2003 | Saito et al. | 362/84 |
| 6,997,572 | B2 * | 2/2006 | Ono et al. | 362/24 |
| 7,667,947 | B2 * | 2/2010 | Schilling et al. | 361/290 |
| 2002/0144886 | A1 | 10/2002 | Engelmann et al. | |
| 2009/0067151 | A1 * | 3/2009 | Sahlin et al. | 362/23 |

FOREIGN PATENT DOCUMENTS

| | | |
|---|---|---|
| EP | 2048781 | 4/2009 |
| WO | 2006/064234 A1 | 6/2006 |
| WO | 2008/012491 A1 | 1/2008 |
| WO | WO 2008012491 A1 * | 1/2008 |

OTHER PUBLICATIONS

International PCT Search Report and Written Opinion, PCT/US2010/044845, 15 pages, mailed Oct. 26, 2010.

* cited by examiner

*Primary Examiner* — David V Bruce
(74) *Attorney, Agent, or Firm* — King & Spalding L.L.P.

(57) ABSTRACT

Backing lighting of induction touch keys is accomplished with a spacer layer surrounding an inductive touch sensor coil and a light source on a substrate, and light transmissive layer having a suspended metal disk proximate to the inductive touch sensor coil. A protective fascia may be placed over the light transmissive layer and spacer layer. When the light transmissive layer is displaced toward the inductive touch sensor coil the impedance value of the inductive touch sensor coil changes and the change is detected. Materials used that are translucent (light transmissive) may be continuous and solid, and opaque materials may have openings therein for transmission of light therethrough.

38 Claims, 3 Drawing Sheets

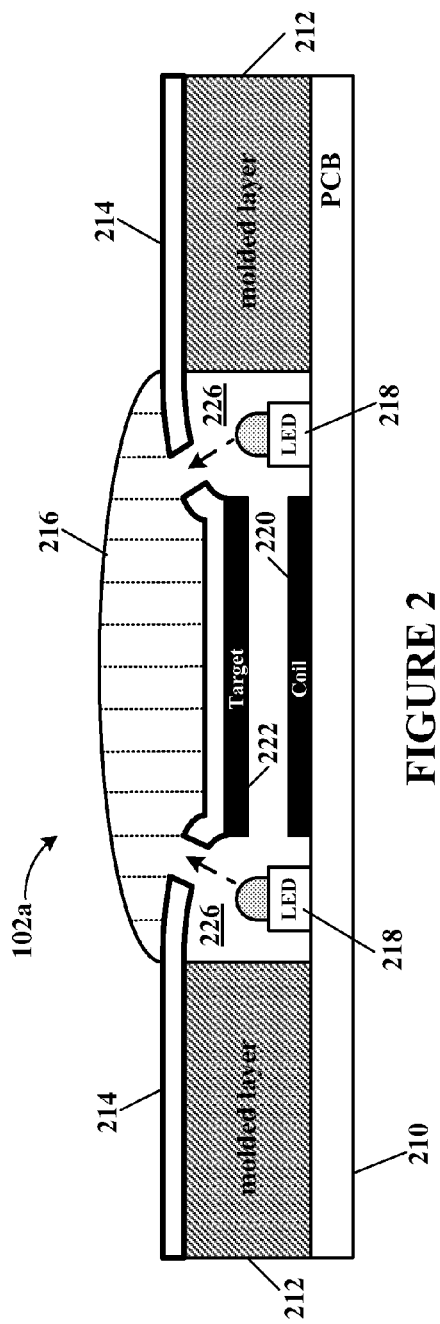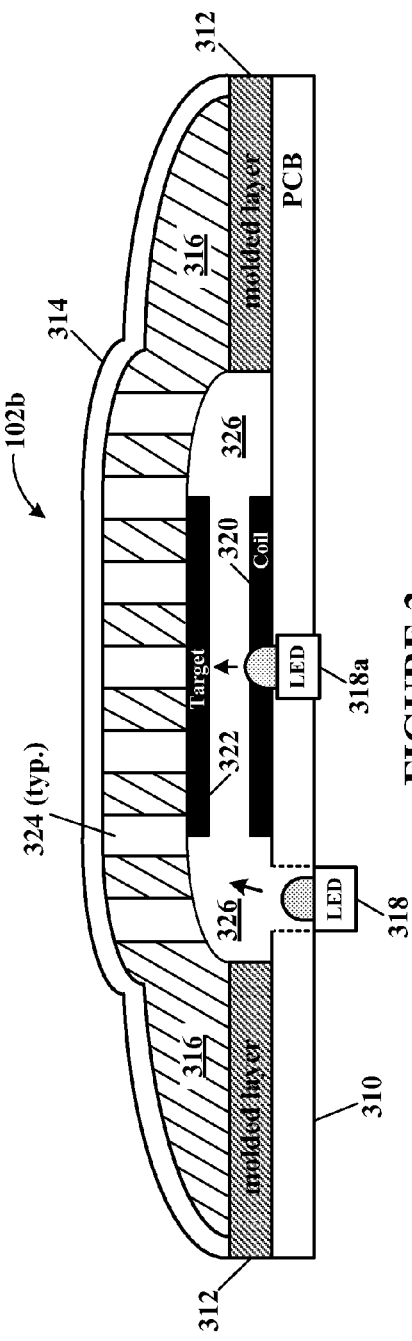

BACKLIGHTING INDUCTIVE TOUCH BUTTONS

RELATED PATENT APPLICATION

This application claims priority to commonly owned U.S. Provisional Patent Application Ser. No. 61/238,718; filed Sep. 1, 2009; entitled "Backlighting Inductive Touch Buttons," by Stephen B. Porter and Keith E. Curtis; and is hereby incorporated by reference herein for all purposes.

TECHNICAL FIELD

The present disclosure relates to inductive touch sensor keys or buttons, and, more particularly, to backlighting of the inductive touch sensor keys or buttons.

BACKGROUND

Each inductive touch sensor key or button comprises an inductive sensor on a substrate, a thin non-magnetic spacer layer over the inductive touch sensor, and a deformable metal target layer (e.g., key or button) over the thin non-magnetic spacer layer. When the deformable metal target layer is depressed, the inductive sensor detects a change in its impedance. This change in impedance is detected and is used to indicate that the key or button has been pressed. A problem exists however in that the deformable metal target layer is light opaque and therefore precludes backlighting thereof. Existing published solutions for inductive touch sensor designs are mechanically very thin. They rely on simple flat spacer layers less than 0.020 inch thick and continuous conductive metal sheets for targets that do not allow light to pass therethrough.

SUMMARY

Therefore what is needed is a way to backlight inductive touch sensor keys or buttons. According to the teachings of this disclosure, a molded spacer layer and a discrete metal disk may be used for the inductive target. By using either reverser mount or side illuminating LED(s) with a suspended metal target, inductive touch sensor keys may be backlit. Backlighting of inductive touch sensor keys or buttons is especially desirable for use in appliances, automotive controls, consumer products such as television set top box converters for cable or satellite television reception, security entry pads, intercom buttons, computers, industrial control panels, etc. Backlighting of the keys or buttons may be used to indicate that the key or button has been pressed, e.g., visual feedback, and/or improved visibility under poor lighting conditions.

There are several things that are needed to complete backlighting for inductive touch buttons. Inductive touch buttons in most cases require that the metal fascia be the target, but according to the teachings of this disclosure it would be moved away from the inductive coil to the point where it will not work as the target. To counteract this, a suspended target proximate to the inductive sensor coil is used. By configuring the lighted inductive touch buttons as such, height may be added to the inductive touch panel design that will allow placement of light emitting diodes (LEDs) on the top and/or bottom side(s) of the circuit board comprising the inductive sensor coil.

By moving the front button layer farther from the substrate, e.g., inductive touch printed circuit board (PCB), a molded plastic layer(s) may be used to create light pipes that allow for backlighting of the inductive touch sensor buttons. A metallic target layer is attached and/or molded on the plastic layer proximate to the inductive sensor coil. As this metallic target layer moves closer to the inductor sensor coil when the button is depressed, the impedance of the inductor sensor coil thereby changes and is detected. The metallic target layer may also be used as a shield to prevent or reduce hot (bright) spots in the lighting of the inductive touch sensor button.

The material that holds the suspended metallic target may be translucent and function as a light pipe for the light from a light source, e.g., light emitting diodes (LEDs). This translucent material may also function as a seal for the holes that may now be placed in the metal cover to allow light to pass therethrough. The material that is used as the spacer surrounding the inductive coil may be of a non-translucent material so as to prevent bleeding of light from one adjacent button to the next.

The light source LEDs do not have to be mounted on the top side of the circuit board, as they can be mounted elsewhere as needed. Also the top layer does not have to be flat or even metal, and it may be curved or use an over-mold process for sealing of the button.

According to a specific example embodiment of this disclosure, a backlit inductive touch sensor key comprises: a substrate; an inductive sense coil on the substrate; a light source; a spacer layer on the substrate and having an opening that surrounds the inductive sense coil and the light source; and a over-layer having opening therein to allow light to pass therethrough from the light source, the over-layer is attached to the spacer layer and forms a light transmission cavity between the substrate and the over-layer; and an over-mold button attached to a side of the over-layer opposite to the light transmission cavity, the over-mold button being light transmissive; wherein when the over-mold button is biased toward the inductive sense coil, an impedance value of the inductive sense coil changes.

According to another specific example embodiment of this disclosure, a backlit inductive touch sensor key comprises: a substrate; an inductive sense coil on the substrate; a light source; a spacer layer on the substrate and having an opening that surrounds the inductive sense coil and the light source; and a flexible layer of light transmissive material, the flexible layer is over the inductive sense coil and light source, and is attached to the spacer layer wherein a light transmission cavity is formed between the substrate and the flexible layer; wherein when the flexible layer is biased toward the inductive sense coil, an impedance value of the inductive sense coil changes.

According to yet another specific example embodiment of this disclosure, a backlit inductive touch sensor key comprises: a substrate; an inductive sense coil on the substrate; a light source; a spacer layer on the substrate and having an opening that surrounds the inductive sense coil and the light source; a flexible fascia layer adapted to allow light therethrough, the flexible fascia layer is over the inductive sense coil and light source, and is attached to the spacer layer wherein a light transmission cavity is formed between the substrate and the flexible fascia layer; a light translucent layer attached to a side of a portion of the flexible fascia layer facing and inside of the light transmission cavity; and a metal target attached to a face of the light translucent layer proximate to the inductive sense coil; wherein when the flexible fascia layer is biased toward the inductive sense coil, an impedance value of the inductive sense coil changes.

BRIEF DESCRIPTION OF THE DRAWINGS

A more complete understanding of the present disclosure thereof may be acquired by referring to the following description taken in conjunction with the accompanying drawings wherein:

FIG. 2 is a schematic elevational view of a back-lighted inductive touch key comprising a light transmissive button in combination with an over-layer having holes therein for light to pass therethrough, according to a specific example embodiment of this disclosure;

FIG. 3 is a schematic elevational view of a back-lighted inductive touch key comprising a light transmissive layer and a protective over-layer adapted for light to pass therethrough, according to another specific example embodiment of this disclosure.

Figure 1:
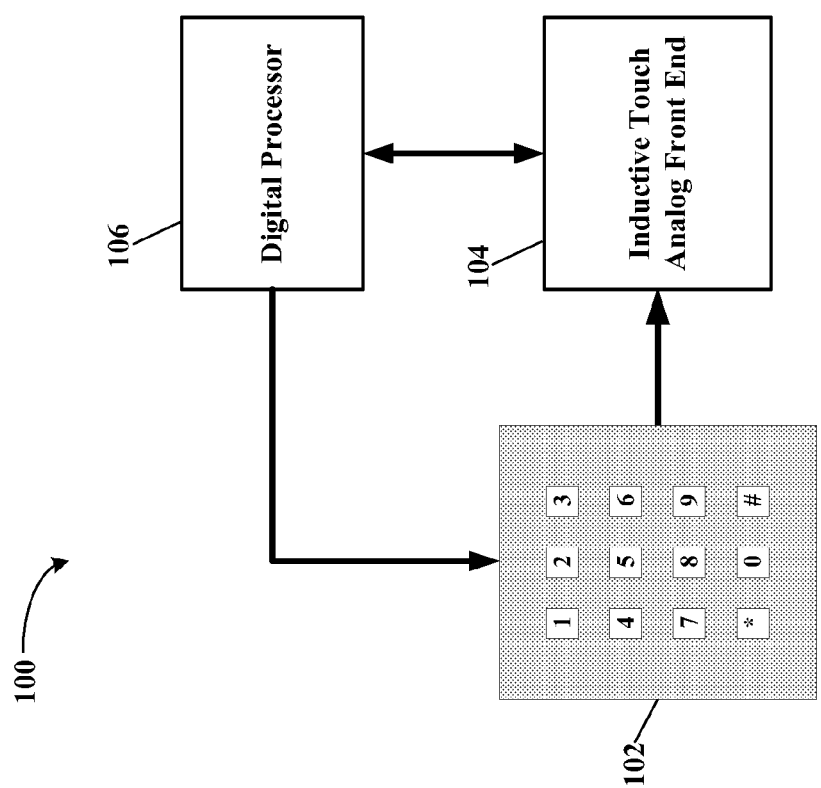
FIG. 1 is a schematic block diagram of an electronic system having an inductive touch keypad, an inductive touch analog front end and a digital processor, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a schematic block diagram of an electronic system having an inductive touch keypad, an inductive touch analog front end and a digital processor, according to the teachings of this disclosure. A digital processor 106, e.g., a microprocessor, microcomputer, digital signal processor (DSP), application specific integrated circuit (ASIC), programmable logic array (PLA), etc., is coupled to an inductive touch analog front end (AFE) 104 and a matrix of inductive touch sensor keys 102, e.g., pushbuttons, levers, toggles, targets, handles, knobs, etc. Typical inductive touch sensor keys 102 may comprise Microchip inductive mTouch™ sensors more fully described at www.microchip.com. The digital processor 106 and AFE 104 may be part of a mixed signal (analog and digital circuits) integrated circuit device.

The inductive touch AFE 104 facilitates, with a single low-cost integrated circuit device, all active functions used in determining when there is actuation of inductive sensors, e.g., by pressing and deflecting a target key that changes the impedance value of an associated inductive sensor. The inductive touch AFE 104 measures the impedance value of each sensor of the matrix of inductive touch sensor keys 102 and converts the impedance values into respective analog direct current (dc) voltages that are read and converted into digital values by the digital processor 106.

The digital processor 106 supplies clock and control functions to the inductive touch AFE 104, reads the analog voltage detector output of the inductive touch AFE 104, and selects each key of the matrix of inductive touch sensor keys 102. When actuation of a key of the matrix of inductive touch sensor keys 102 is determined, the digital processor 106 will take an appropriate action.

According to the teachings of this disclosure, each key (touch buttons) of the matrix of inductive touch sensor keys 102 is illuminated, as more fully disclosed hereinafter.

Referring to FIG. 2, depicted is a schematic elevational view of a back-lighted inductive touch key comprising a light transmissive button in combination with an over-layer having holes therein for light to pass therethrough, according to a specific example embodiment of this disclosure. A back-lighted inductive touch key 102a comprises a substrate 210, e.g., printed circuit board (PCB); an inductive sense coil 220, a light source, e.g., light emitting diodes (LEDs) 218; a non-translucent (opaque) molded spacer layer 212 surrounds the inductive sense coil 220 and LEDs 218, an over-layer 214 having openings therein for light from the LEDs 218 to pass therethrough, and an over-mold button 216 that is translucent for illumination thereof by the light from the LEDs 218. In addition, if the over-layer 214 is non-metallic then a metallic target 222 is disposed on a surface of the over-layer 214 proximate to the inductive sense coil 220. A metallic over-layer 214 may be for example, but is not limited to, aluminum, steel, stainless steel, copper, titanium, etc. A non-metallic over-layer 214 may be for example, but is not limited to, plastic, Teflon, polyamide, etc.

The molded spacer layer 212 surrounding the inductive sense coil 220 and LEDs 218 is substantially non-translucent (opaque) so that light does not bleed over to another adjacent back-lighted inductive touch key (not shown). The LEDs 218 (light source) may be mounted on top of the substrate 210, and inside of a cavity 226 formed by the substrate 210, the molded spacer layer 212 and the over-layer 214. The LEDs 218 may also be mounted in the substrate 210 or on the opposite side thereof (e.g., LED 318a or LED 318, respectively, of FIG. 3). LEDs 218 may be on either side and/or inside of the inductive sense coil 220.

The over-mold button 216 is flexible wherein when pushed (actuated) by an external force, e.g., push from a finger, the over-layer 214 portion over inductive sense coil 220 moves closer thereto and thereby changes the impedance thereof. If the over-layer 214 is non-metallic and does not affect the impedance of the inductive sense coil 220, then a metallic target 222 may be attached to the over-layer 214 proximate to the inductive sense coil 220. The inductive touch AFE 104 (FIG. 1) detects this change in impedance of the sense coil 220 and indicates this event to the digital processor 106 for appropriate action to be taken. For example, but not limited to, a change in intensity and/or color of the light from the LEDs 218 may indicate successful actuation of this specific inductive touch sensor key 102a. It is contemplated and within the scope of this disclosure that the over-layer 214 portion over the inductive sense coil 220 and/or the target 222 may be any type of material that affects the impedance value of the inductive sense coil 220 when there is a change in distance therebetween.

Referring to FIG. 3, depicted is a schematic elevational view of a back-lighted inductive touch key comprising a light transmissive layer and a protective over-layer adapted for light to pass therethrough, according to another specific example embodiment of this disclosure. A back-lighted inductive touch key 102b comprises a substrate 310, e.g., a printed circuit board (PCB); an inductive sense coil 320, a light source, e.g., light emitting diodes (LEDs) 318 and/or 318a; a non-translucent (opaque) molded spacer layer 312 surrounds the inductive sense coil 320 and LEDs 318, a light transmissive layer 316, a metallic target 322 attached to the layer 316 and proximate to the inductive sense coil 320, and an over-layer 314 that a portion thereof is either light transmissive or has openings therein for light from the LEDs 318 to pass therethrough.

The molded spacer layer 312 surrounding the inductive sense coil 320 and LEDs 318 and/or 318a is substantially non-translucent (opaque) so that light does not bleed over to another adjacent back-lighted inductive touch key (not shown). The LEDs 318 (light source) may be mounted on top of the substrate 310 (e.g., LED 218 of FIG. 2) and inside of a cavity 326 formed by the substrate 310, the molded spacer layer 312 and the light transmissive layer 316. The LEDs 318a may also be mounted in the substrate 310 or on the opposite side thereof, e.g., LED 318. LEDs 318 may be on either side and/or inside of the inductive sense coil 320.

The light transmissive layer 316 may be flexible wherein when pushed (actuated) by an external force, e.g., push from a finger, the light transmissive layer 316 portion over inductive sense coil 320 moves closer thereto and thereby changes the impedance thereof. If the light transmissive layer 316 is not made of a flexible and/or light transmissive material then openings or gaps 324 may be disposed within a portion of the light transmissive layer 316 for light from the LEDs 318 to pass therethrough.

The over-layer 314 may be used for protection from physical abuse and/or harmful water and/or chemical infiltration. The over-layer 314 may comprise a thin metal layer, e.g., aluminum, steel, stainless steel, copper, titanium, etc. or a non-metallic layer, e.g., plastic, Teflon, polyamide, etc. If the material of the over-layer 314 is not light transmissive then opening may be placed therein (not shown) for light transmission therethrough.

If the light transmissive layer 316 is non-metallic and does not affect the impedance of the inductive sense coil 320, then a metallic target 322 may be attached to the light transmissive layer 316 proximate to the inductive sense coil 320. The inductive touch AFE 104 (FIG. 1) detects a change in impedance of the sense coil 320 and indicates this event to the digital processor 106 for appropriate action to be taken. For example, but not limited to, a change in intensity and/or color of the light from the LEDs 318 may indicate successful actuation of this specific inductive touch sensor key 102b. It is contemplated and within the scope of this disclosure that the light transmissive layer 316 and/or the target 322 over the inductive sense coil 320 may be any type of material that affects the impedance value of the inductive sense coil 320 when there is a change in distance therebetween. The target 322 may also provide light shielding an light diffusion from the light source, e.g., LED 318a, so as to prevent light intensity "hot spots" in the back-lighted inductive touch key 102b.

Figure 4:
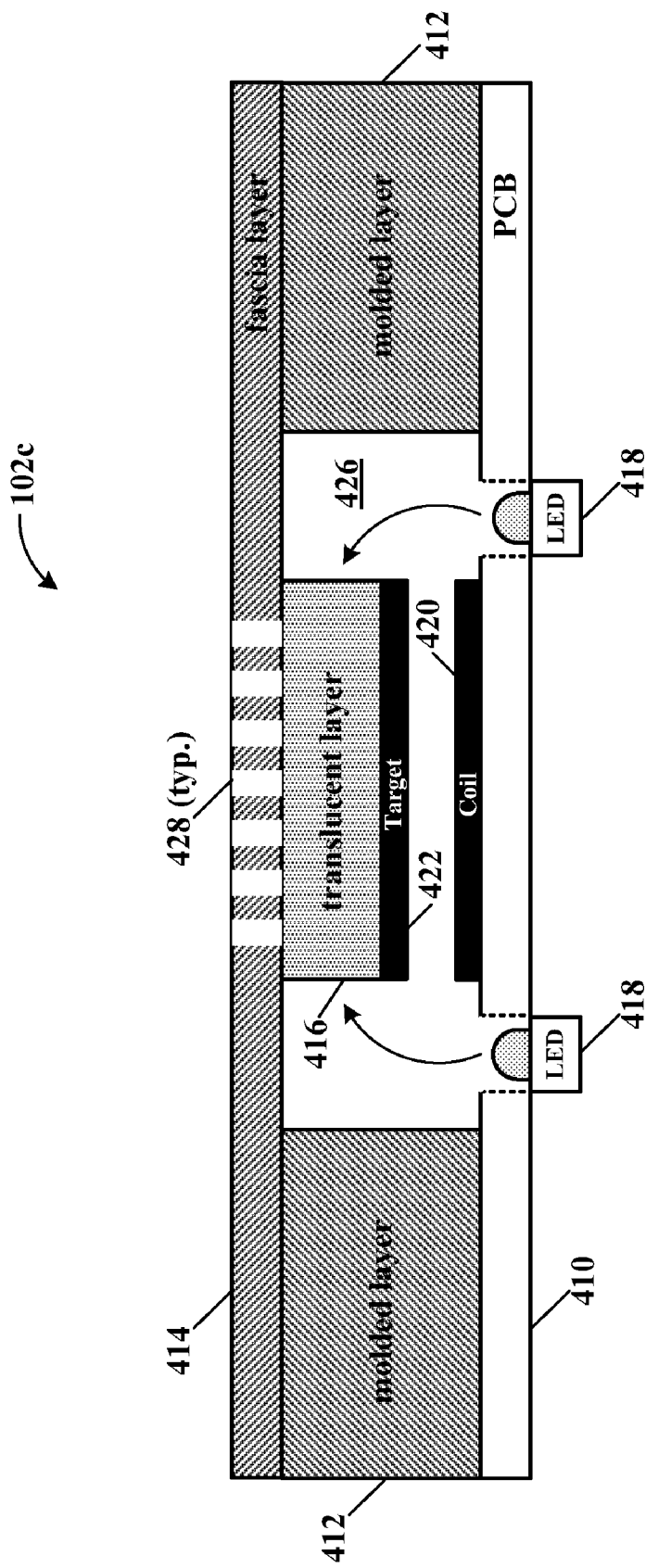
FIG. 4 is a schematic elevational view of a back-lighted inductive touch key comprising a flat fascia adapted for light to pass therethrough, according to yet another specific example embodiment of this disclosure.

Referring to FIG. 4, depicted is a schematic elevational view of a back-lighted inductive touch key comprising a flat fascia adapted for light to pass therethrough, according to yet another specific example embodiment of this disclosure. A back-lighted inductive touch key 102c comprises a substrate 410, e.g., a printed circuit board (PCB); an inductive sense coil 420, a light source, e.g., light emitting diodes (LEDs) 418; a non-translucent (opaque) molded spacer layer 412 surrounds the inductive sense coil 420 and LEDs 418, a light transmissive (translucent) layer 416, a metallic target 422 attached to the layer 416 and proximate to the inductive sense coil 420, and an over-layer fascia 414 that a portion thereof is either light transmissive or has openings therein for light from the light transmissive layer 416 to pass therethrough.

The over-layer fascia 414 may be substantially flat and attached to the non-translucent (opaque) molded spacer layer 412 for support thereof. The light transmissive layer 416 is attached to the over-layer fascia 414 and in cooperation therewith moves the metallic target 422 closer to the inductive sense coil 420 when a force is applied to the over-layer fascia 414 proximate to the light transmissive layer 416. The light transmissive layer 416 serves as a light pipe for illumination of an information area of the over-layer fascia 414. The material of the over-layer fascia 414 may comprise metal or be nonmetallic as desired, and if this material is opaque (non-light transmissive), openings 428 therein may be provided for light to pass therethrough.

The molded spacer layer 412 surrounding the inductive sense coil 420 and LEDs 418 is substantially non-translucent (opaque) so that light does not bleed over to another adjacent back-lighted inductive touch key (not shown). The LEDs 418 (light source) may be mounted on top of the substrate 410 (e.g., LED 218 of FIG. 2) and inside of a cavity 426 formed by the substrate 410, the molded spacer layer 412 and the over-layer fascia 414. The LEDs 418 may also be mounted in the substrate 410, e.g., LED 318a. LEDs 418 may be on either side and/or inside of the inductive sense coil 420. The over-layer fascia 414 may be used for protection from physical abuse and/or harmful water and/or chemical infiltration. The over-layer fascia 414 may comprise a thin metal layer such as for example, but is not limited to, aluminum, steel, stainless steel, copper, titanium, etc., or a non-metallic layer such as for example, but is not limited to, plastic, Teflon, polyamide, etc.

The inductive touch AFE 104 (FIG. 1) detects a change in impedance of the sense coil 420 and indicates this event to the digital processor 106 for appropriate action to be taken. For example, but not limited to, a change in intensity and/or color of the light from the LEDs 418 may indicate successful actuation of this specific inductive touch sensor key 102c. It is contemplated and within the scope of this disclosure that the light transmissive layer 416 and/or the target 422 over the inductive sense coil 420 may be any type of material that affects the impedance value of the inductive sense coil 420 when there is a change in distance therebetween.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:
1. A backlit inductive touch sensor key, comprising:
a substrate;
an inductive sense coil on the substrate;
a light source;
a spacer layer on the substrate and having an opening that surrounds the inductive sense coil and the light source; and
a over-layer having opening therein to allow light to pass therethrough from the light source, the over-layer is attached to the spacer layer and forms a light transmission cavity between the substrate and the over-layer; and an over-mold button attached to a side of the over-layer opposite to the light transmission cavity, the over-mold button being light transmissive;

wherein when the over-mold button is biased toward the inductive sense coil, an impedance value of the inductive sense coil changes.

2. The backlit inductive touch sensor key according to claim 1, further comprising a metal target attached on a face of the over-layer proximate to the inductive sense coil, wherein when the metal target is biased toward the inductive sense coil, the impedance value of the inductive sense coil changes.

3. The backlit inductive touch sensor key according to claim 1, wherein the light source is at least one light emitting diode (LED).

4. The backlit inductive touch sensor key according to claim 3, wherein the at least one LED is on a same side of the substrate as the inductive sense coil and illuminates the light transmission cavity.

5. The backlit inductive touch sensor key according to claim 3, wherein the at least one LED is on an opposite side of the substrate as the inductive sense coil and illuminates the light transmission cavity.

6. The backlit inductive touch sensor key according to claim 3, wherein the at least one LED is in the substrate and illuminates the light transmission cavity.

7. The backlit inductive touch sensor key according to claim 1, wherein the over-layer is metal.

8. The backlit inductive touch sensor key according to claim 7, wherein the metal over-layer is selected from the group consisting of aluminum, steel, stainless steel, copper, and titanium.

9. The backlit inductive touch sensor key according to claim 1, wherein the over-layer is nonmetallic.

10. The backlit inductive touch sensor key according to claim 9, wherein the nonmetallic over-layer is selected from the group consisting of plastic, Teflon, and polyamide.

11. The backlit inductive touch sensor key according to claim 1, wherein the substrate is a printed circuit board.

12. A backlit inductive touch sensor key, comprising:
a substrate;
an inductive sense coil on the substrate;
a light source;
a spacer layer on the substrate and having an opening that surrounds the inductive sense coil and the light source; and
a flexible layer of light transmissive material, the flexible layer is over the inductive sense coil and light source, and is attached to the spacer layer wherein a light transmission cavity is formed between the substrate and the flexible layer;
wherein when the flexible layer is biased toward the inductive sense coil, an impedance value of the inductive sense coil changes.

13. The backlit inductive touch sensor key according to claim 12, further comprising a metal target attached on a face of the flexible layer proximate to the inductive sense coil, wherein when the metal target is biased toward the inductive sense coil, the impedance value of the inductive sense coil changes.

14. The backlit inductive touch sensor key according to claim 12, wherein the light source is at least one light emitting diode (LED).

15. The backlit inductive touch sensor key according to claim 14, wherein the at least one LED is on a same side of the substrate as the inductive sense coil and illuminates the light transmission cavity.

16. The backlit inductive touch sensor key according to claim 14, wherein the at least one LED is on an opposite side of the substrate as the inductive sense coil and illuminates the light transmission cavity.

17. The backlit inductive touch sensor key according to claim 14, wherein the at least one LED is in the substrate and illuminates the light transmission cavity.

18. The backlit inductive touch sensor key according to claim 12, further comprising an over-layer on the flexible layer.

19. The backlit inductive touch sensor key according to claim 18, wherein the over-layer is made of light transmissive material.

20. The backlit inductive touch sensor key according to claim 18, wherein the over-layer is made of light opaque material and has opening therein for light from the light source to pass therethrough.

21. The backlit inductive touch sensor key according to claim 18, wherein the over-layer is metal.

22. The backlit inductive touch sensor key according to claim 21, wherein the metal over-layer is selected from the group consisting of aluminum, steel, stainless steel, copper, and titanium.

23. The backlit inductive touch sensor key according to claim 18, wherein the over-layer is nonmetallic.

24. The backlit inductive touch sensor key according to claim 23, wherein the nonmetallic over-layer is selected from the group consisting of plastic, Teflon, and polyamide.

25. The backlit inductive touch sensor key according to claim 12, wherein the flexible layer has opening therein for flexure and for light from the light source to pass therethrough.

26. The backlit inductive touch sensor key according to claim 12, wherein the substrate is a printed circuit board.

27. A backlit inductive touch sensor key, comprising:
a substrate;
an inductive sense coil on the substrate;
a light source;
a spacer layer on the substrate and having an opening that surrounds the inductive sense coil and the light source;
a flexible fascia layer adapted to allow light therethrough, the flexible fascia layer is over the inductive sense coil and light source, and is attached to the spacer layer wherein a light transmission cavity is formed between the substrate and the flexible fascia layer;
alight translucent layer attached to aside of a portion of the flexible fascia layer facing and inside of the light transmission cavity; and
a metal target attached to a face of the light translucent layer proximate to the inductive sense coil;
wherein when the flexible fascia layer is biased toward the inductive sense coil, an impedance value of the inductive sense coil changes.

28. The backlit inductive touch sensor key according to claim 27, wherein the light source is at least one light emitting diode (LED).

29. The backlit inductive touch sensor key according to claim 28, wherein the at least one LED is on a same side of the substrate as the inductive sense coil and illuminates the light transmission cavity.

30. The backlit inductive touch sensor key according to claim 28, wherein the at least one LED is on an opposite side of the substrate as the inductive sense coil and illuminates the light transmission cavity.

31. The backlit inductive touch sensor key according to claim 28, wherein the at least one LED is in the substrate and illuminates the light transmission cavity.

32. The backlit inductive touch sensor key according to claim 27, wherein the flexible fascia layer is made of light transmissive material.

33. The backlit inductive touch sensor key according to claim 27, wherein the flexible fascia layer is made of light opaque material and has opening therein for light from the light source to pass therethrough.

34. The backlit inductive touch sensor key according to claim 27, wherein the flexible fascia layer is metal.

35. The backlit inductive touch sensor key according to claim 34, wherein the flexible metal fascia layer is selected from the group consisting of aluminum, steel, stainless steel, copper, and titanium.

36. The backlit inductive touch sensor key according to claim 27, wherein the flexible fascia layer is nonmetallic.

37. The backlit inductive touch sensor key according to claim 36, wherein the flexible nonmetallic fascia layer is selected from the group consisting of plastic, Teflon, and polyamide.

38. The backlit inductive touch sensor key according to claim 27, wherein the substrate is a printed circuit board.

* * * * *